(12) United States Patent  
Cremer

(10) Patent No.: US 12,308,514 B2  
(45) Date of Patent: May 20, 2025

(54) THERMAL AND ELECTRICAL INSULATION STRUCTURE

(71) Applicant: STMicroelectronics (Crolles 2) SAS, Crolles (FR)

(72) Inventor: Sebastien Cremer, Sassenage (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 535 days.

(21) Appl. No.: 17/701,340

(22) Filed: Mar. 22, 2022

(65) Prior Publication Data

US 2022/0320722 A1 Oct. 6, 2022

(30) Foreign Application Priority Data

Mar. 31, 2021 (FR) .................................. 2103351

(51) Int. Cl.  
*H01Q 1/38* (2006.01)  
*H01Q 1/00* (2006.01)  
*H01Q 1/22* (2006.01)

(52) U.S. Cl.  
CPC ............. *H01Q 1/38* (2013.01); *H01Q 1/002* (2013.01); *H01Q 1/2283* (2013.01)

(58) Field of Classification Search  
CPC . H01L 21/76289; H01L 21/764; H01L 24/05; H01L 21/2007; H01L 24/80  
See application file for complete search history.

(56) References Cited

U.S. PATENT DOCUMENTS

| 5,122,856 | A | 6/1992 | Komiya |
| 7,172,980 | B2 | 2/2007 | Torres et al. |
| 11,960,154 | B2 * | 4/2024 | Bovington ............ G02F 1/0147 |
| 2006/0252229 | A1 | 11/2006 | Joly et al. |
| 2014/0264948 | A1 * | 9/2014 | Chou ................ H01L 23/53228 438/109 |
| 2015/0251901 | A1 * | 9/2015 | Cheng ................. B81C 1/00325 438/51 |
| 2016/0197049 | A1 | 7/2016 | Chen et al. |
| 2017/0069593 | A1 * | 3/2017 | Chou ..................... H01L 23/498 |
| 2017/0256663 | A1 * | 9/2017 | Matthias ............. H01L 31/0512 |
| 2017/0330790 | A1 | 11/2017 | He et al. |
| 2019/0393067 | A1 * | 12/2019 | Wang ................ H01L 21/67092 |
| 2020/0020632 | A1 | 1/2020 | Maeda et al. |
| 2020/0328165 | A1 * | 10/2020 | DeLaCruz ............. H01L 24/05 |
| 2021/0159873 | A1 * | 5/2021 | Lan ...................... H03H 3/0072 |
| 2023/0275012 | A1 * | 8/2023 | Pan .................. H01L 23/49838 257/774 |

* cited by examiner

*Primary Examiner* — Mamadou L Diallo  
(74) *Attorney, Agent, or Firm* — Seed IP Law Group LLP

(57) ABSTRACT

The present disclosure relates to a method of making an electronic device comprising a first wafer including at least one trench and a second wafer, the second wafer being bonded, by hybrid bonding, to the first wafer, so as to form, at the level of the trench, at least one enclosed space, empty or gas-filled.

20 Claims, 7 Drawing Sheets

THERMAL AND ELECTRICAL INSULATION STRUCTURE

CROSS-REFERENCE TO RELATED APPLICATION

This application claims the priority benefit of French patent application number 21/03351 filed on Mar. 31, 2021 entitled "Structure d'isolation thermique et électrique," which is hereby incorporated by reference to the maximum extent allowable by law.

BACKGROUND

Technical Field

The present disclosure relates generally to electrical and thermal insulation structures in electronic devices and, more particularly, to the use of enclosed spaces, either empty or gas-filled, in electronic devices for electrical or thermal insulation purposes.

Description of the Related Art

Various structures are known for thermally and electrically insulating all or part of an electronic device.

BRIEF SUMMARY

There is a need for improved thermal and electrical insulation structures and their manufacturing methods.

One embodiment addresses all or some of the drawbacks of known insulation structures.

One embodiment provides a method of manufacturing an electronic device comprising a first wafer having at least one trench and a second wafer, the second wafer being bonded, by hybrid bonding, to the first wafer, so as to form, at the trench, at least one enclosed space, either empty or gas-filled.

In another embodiment, an electronic device is provided comprising a first wafer including at least one trench and a second wafer, the second wafer being bonded, by hybrid bonding, to the first wafer so as to form at least one enclosed space at the trench that is either empty or gas-filled.

According to one embodiment, the first and second wafers are made of semiconductor material.

According to one embodiment, the hybrid bonding is achieved by putting the first regions of the second wafer into contact with the second regions of the first wafer.

According to one embodiment, the first regions and the second regions are metallic regions.

According to one embodiment, the first and second regions are part of a metallization level.

According to one embodiment, the metallic regions are copper.

According to one embodiment, the first regions and the second regions surround the trenches.

According to one embodiment, the first regions and the second regions are misaligned in the device stack with a distance d less than 600 nm.

According to one embodiment, the second regions are flush with a face of the first wafer, from which the trenches are formed.

According to one embodiment, each device includes two first and two second regions on either side of the trenches in a direction orthogonal to the largest dimension of the trenches.

According to one embodiment, the second wafer comprises successively, from a semiconductor substrate, an oxide layer, a silicon nitride layer, and an insulating layer comprising the first regions.

According to one embodiment, the semiconductor substrate and the oxide layer are removed from the second wafer after the hybrid bonding.

According to one embodiment, the first wafer comprises a substrate in and on which the transistors are formed.

According to one embodiment, the gate of each transistor is surmounted by one of the said enclosed spaces.

According to one embodiment, the trenches have a width between 0.2 µm and 1 µm and extend to a height between 0.2 µm and 1 µm.

According to one embodiment, the device is a radio frequency switch.

According to one embodiment, the device is a low noise amplifier.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and functional features that are common among the various embodiments may have the same references and may dispose identical structural, dimensional, and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%. Air gaps are used in the microelectronics industry to reduce parasitic capacitance and improve electrical insulation between conductive tracks. A particular example of application relates to the insulation between gate conductors and drain and source contacts of MOS transistors, especially in radio frequency switch applications. The air gap technique is also used in photonic applications (laser detection) for thermal insulation purposes.

The described embodiments provide for a new technique for producing air gaps in steps (generally referred to as "back end" or post treatment) for producing interconnections between semiconductor devices produced during prior steps (generally referred to as "front end").

As is usual in the microelectronics industry, many identical devices are produced in batches from wafers of semiconductor material before being cut (singulated) to form integrated circuits. For simplicity, the embodiments are described with reference to a single device, with the understanding that the steps described are preferably performed on entire wafers. Also, the described device is in practice integrated with several other structures and elements forming the integrated circuit of which it is a part.

Figure 1:
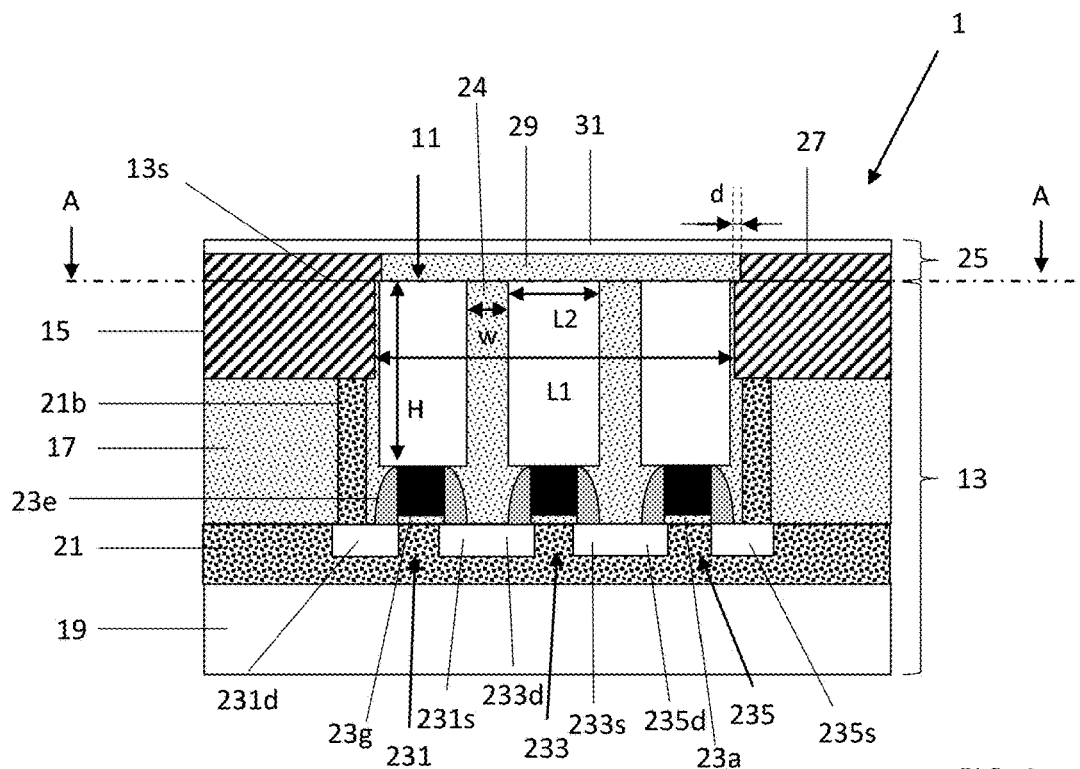
FIG. 1 is a partial schematic cross-sectional view of one embodiment of an electronic device.
Figure 2:
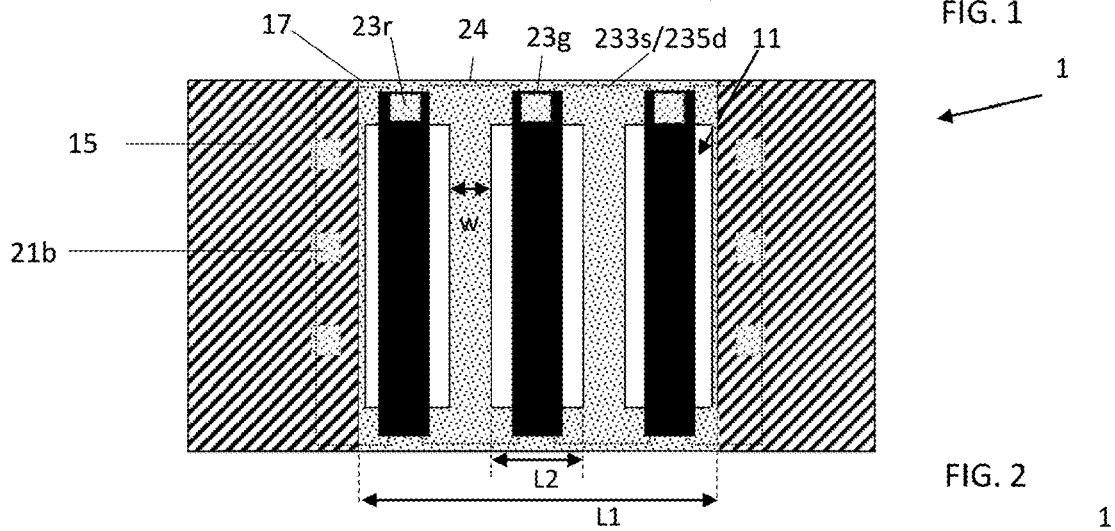
FIG. 2 is a partial schematic top view in a plane AA of FIG. 1 of the electronic device illustrated in FIG. 1.
Figure 3:
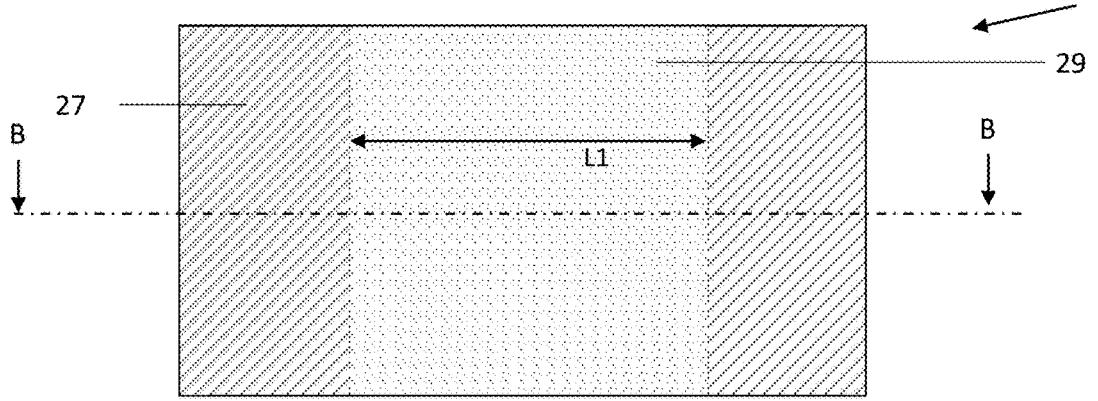
FIG. 3 is a partial schematic top view of the electronic device illustrated in FIG. 1.

FIGS. 1 to 3 are partial and schematic views of one embodiment of an electronic device 1 comprising at least one enclosed space 11.

FIG. 1 is a cross-sectional view of one embodiment of the electronic device 1.

FIG. 2 is a top view in the longitudinal plane AA of FIG. 1.

FIG. 3 is a partial schematic top view of the electronic device 1, with FIG. 1 being a view along the cross-sectional plane BB of FIG. 3.

By way of example, the device 1 is a radio frequency switch or low noise amplifier.

In FIGS. 1 to 3, three enclosed spaces 11 are represented. However, in practice, the number of closed spaces 11 depends on the device being produced and the application. This number is at least one, with no upper limit.

Each enclosed space 11 is either empty (the produced vacuum is at least partial) or filled with a gas. The gas in the enclosed spaces 11 is, for example, an inert gas such as argon, nitrogen, or a gas mixture.

In the example of FIG. 1, the device 1 includes field effect transistors whose gates are isolated from overlying metallization levels by an enclosed space that is free of material, either empty or gas-filled.

The device 1 is an assembly of:
a structure 13 comprising trenches that partially delimit, within the device 1, the enclosed spaces 11; and
a structure 25 forming a cover closing the trenches.

In order to form the device 1, the cover structure 25 is placed on the structure 13 comprising the trenches. The structures 25 and 13 are bonded by putting into contact a layer 15 located in the structure 13 and a layer 27 located in the structure 25 to form a hybrid bond.

Each enclosed space 11 extends into the structure 13 from a front face 13s (top in the orientation of FIG. 1). The structure 13 comprises the non-continuous layer 15, for example, divided into two distinct portions located respectively on opposite sides of the enclosed spaces 11 of the device 1. In other words, the enclosed spaces 11 are, for example, located between two portions of the layer 15 respectively left and right in the orientation of FIGS. 1 to 3. According to one embodiment, the edges of the layer 15 are not merged with the side edges of the trenches. That is, the trenches do not open into the portions of the layer 15. As an example, the two portions of the layer 15 are spaced apart by a width L1 of, for example, between 1 µm and 100 µm.

According to one embodiment not represented, the layer 15 corresponds to a ring or a rectangle (for example with rounded corners), surrounding, in plan view, the enclosed spaces 11 of the device 1. According to this embodiment, the internal diameter of the ring or, if applicable, the internal width of the rectangle corresponds to the width L1.

The layer 15 has, for example, a thickness of between 50 nm and 500 nm, preferably of the order of 100 nm.

The layer 15 is, for example, made of a metallic material such as copper. According to the embodiment illustrated in FIGS. 1 to 3, the layer 15 constitutes a metallization level.

The structure 13 is surmounted by the structure 25 comprising the layer 27 located on and in contact with the layer 15 of the structure 13. The layer 27 is preferably made with a similar pattern (two side portions or ring) to the pattern of layer 15.

When assembling the structure 27 with structure 13, an alignment shift or distance d may occur due to tolerances of the equipment used. According to the embodiment illustrated in FIGS. 1 to 3, the offset d is less than 600 nm, preferably less than 400 nm, for example between 200 nm and 400 nm.

As an example, this offset arises because the two side portions of the layer 27 are spaced apart with a distance less than the width L1 or, if applicable, the inner diameter of the ring of the layer 27 is less than the width L1. The offset d is then not necessarily the same on either side of the enclosed spaces 11. That is, the offset is not the same to the right of the enclosed spaces 11 and to the left of the enclosed spaces 11, where the offset d may be at the right side of the enclosed spaces greater or less than the offset d at the left side of the enclosed spaces in the orientation of FIGS. 1 to 3. This provides contact between layer 27 and layer 15 and thus increases the sealing of the enclosed spaces 11.

The layer 27 is preferably made of the same material as the layer 15. For example, the layer 27 is made of copper.

The layer 27 has, for example, a thickness between 50 nm and 200 nm.

The layers 15 and 27 in contact allow for a hybrid bonding of the structures 13 and 25.

The structure 13 also comprises a substrate 19 which can be of various types, such as silicon, which can comprise a base surmounted by a layer of buried oxide (Box). The substrate 19 is, for example, covered by a layer 21 of a semiconductor material such as silicon. According to one embodiment, the layer 21 covers the substrate 19 completely. Preferably, the layer 21 is surmounted with an insulating layer 17 located on and in contact with the layer 21, the layer 15 is located on and in contact with layer 17.

The layer 17 is, for example, of an insulating material such as an insulating oxide.

According to one embodiment, not represented, the device 1 comprises, between the layer 15 and the layer 17 other levels of metallization, the enclosed spaces 11 being able to pass through these levels. In this embodiment, the layer 15 thus comprises the highest metallization level of the structure 13 allowing hybrid bonding.

According to the embodiment illustrated in FIGS. 1 to 3, the structure 13 comprises one or more transistor(s) 23 (231, 233, 235) located in and on the layer 21. The transistors 231, 233, 235 are, for example, connected in series, e.g., the source 231s of transistor 231, respectively 233, is connected to the drain 233d of the transistor 233, respectively 235. According to the embodiment illustrated in FIG. 1, the drain 231d of the transistor 231 is connected to the contact taps 21b, and the source 235s of the transistor 235 is connected to other contact taps 21b. Each transistor 23 comprises, between the drain and the source, a gate conductor or gate contact 23g on and in contact with a gate insulator 23a, itself in contact with and on layer 21. Contact taps 23r of the gates 23g are made, as illustrated in FIG. 2, in a different plane than the cross-section illustrated in FIG. 1. One advantage of connecting the transistors in series is that it eliminates the need for contacts between the transistors 23.

According to one embodiment not represented, the structure 13 comprises the transistors 23 connected in parallel.

The contact taps 21b are, for example, pillars extending through the layer 21 to the layer 15. The pillars 21b extend, through layer 17, preferably from layer 21 to layer 15. According to one embodiment, the pillars 21b are connected to a different metallization level or levels of the layer 15 or, if applicable, to an intermediate layer between the layer 15 and layer 17. In FIGS. 1 to 3, six pillars 21b have been represented. However, in practice, the number of pillars 21b may be different from six. According to the embodiment illustrated in FIGS. 1 to 3, the pillars 21b are separated from the enclosed spaces 11 by a portion of the insulating layer 17.

In FIGS. 1 to 3, each transistor 23 comprises a gate 23g made of a metal or polycrystalline silicon, and two spacers 23e located on either side of the gate 23g in the cross-section illustrated in FIG. 1. The gate 23g of each transistor 23 is framed (laterally in the orientation of FIG. 1), by spacers 23e.

The above description of the transistor structure is only an example, and the described embodiments are transposable to other structures in which air gaps are desired.

According to the embodiment illustrated in FIGS. 1 to 3, the device 1 comprises an enclosed space 11 opposite each gate such that the device comprises the same number of transistors 23 as enclosed spaces 11. Each enclosed space 11 extends from the upper face 13s to the gate 23g of the transistor 23 with which it is associated.

According to the embodiment illustrated in FIGS. 1 to 3, the enclosed spaces 11 are separated by the insulating walls 24 in the same material as the layer 17.

Each enclosed space 11 extends through the structure 13 over a height H of between 0.2 μm and 1 μm. Each enclosed space 11 has, for example, a width L2 between 0.1 μm and 1 μm. The walls 24 (gap between two enclosed spaces 11) have, for example, a width w, for example less than 600 nm.

According to one embodiment, the width w is equal to 0 nm, so the structure 13 does not include the walls 24.

The layer 17 has, for example, a thickness of between 0.2 μm and 0.6 μm, preferably of the order of 0.4 μm.

The layer 21 has, for example, a thickness between the lower face of the layer 17 and the upper face of the substrate 19 of between 30 nm and 200 nm, preferably of the order of 75 nm.

The substrate 19 (base and BOX layer) has, for example, a thickness between 700 μm and 800 μm, preferably between 775 μm and 790 μm, the thickness of the BOX layer of the substrate 19 being, for example, between 20 nm and 1 μm and preferably being of the order of 200 nm.

According to one embodiment, the layers 21 and 19 are the same traditionally treated silicon substrate (bulk). All of the layers 21 and 19 then have a thickness of the order of 775 μm.

According to the embodiment illustrated in FIGS. 1 to 3, the layer 27 of the structure 25 is produced on and in contact with a layer 31. As described above, the layer 27 is formed with a pattern comprising openings facing the enclosed spaces 11, the said openings being filled with a layer 29 also formed on layer 31.

The structure 25 is obtained by thinning a stack comprising, on a semiconductor substrate, an insulating layer, and the layers 27, 29 and 31.

The layer 29 is preferably made of the same material as the layer 24. The layer 29 is, for example, an insulating oxide.

The layer 31 is preferably made of a nitride, for example silicon nitride. As will be discussed below, layer 31 is an etch stop layer.

One advantage of the present embodiment is the reduction of parasitic capacitances between the gate 23g and the drain 23d of the transistors 23 and between the source 23s and the drain 23d of the transistors 23.

FIGS. 4 to 8 illustrate successive steps of an implementation of a manufacturing method of the device 1.

Figure 4:
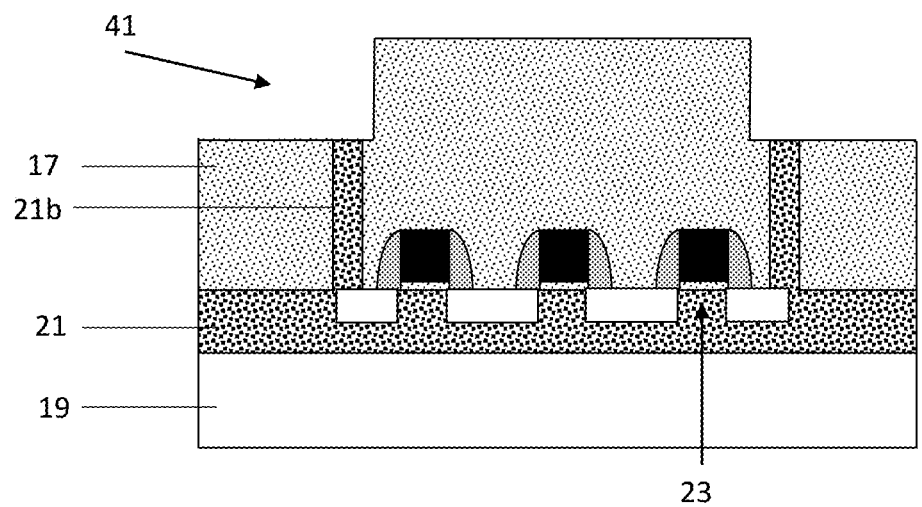
FIG. 4 is a partial schematic cross-sectional view illustrating a step in a method of implementing a manufacturing method for the device of FIGS. 1 to 3.

FIG. 4 is a partial schematic cross-sectional view illustrating a step of the implementation of the manufacturing method of the device 1.

FIG. 4 represents a starting structure comprising the substrate 19, layer 21, and transistors 23 formed in and on the layer 21. In FIG. 4, the layer 21 comprises openings 41 in which the various portions of layer 15 are formed in a later step.

Figure 5:
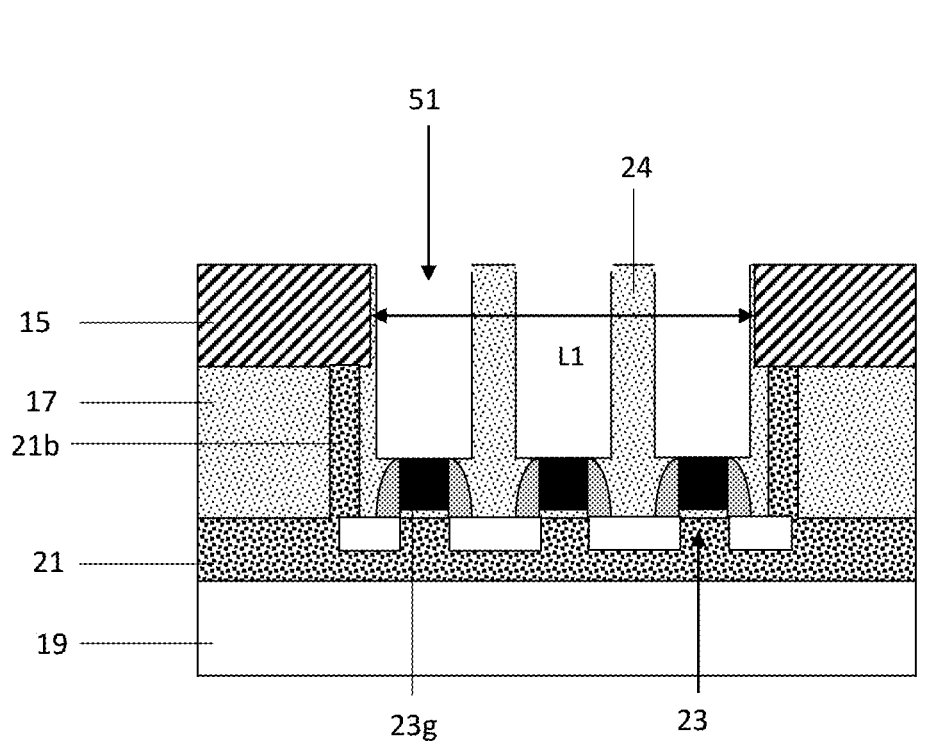
FIG. 5 is a partial schematic cross-sectional view illustrating another step in a method of implementing a manufacturing method for the device of FIGS. 1 to 3.

FIG. 5 is a partial schematic cross-sectional view illustrating another step of the implementation of the manufacturing method of device 1.

FIG. 5 illustrates, a step of forming portions of the layer 15 in the openings 41. The layer 15 is formed by a damascene method during which the layer 15 is deposited on the surface of the structure illustrated in FIG. 4 and particularly in the openings 41. For example, after the layer 15 has been deposited, the parts of the layer 15 outside the openings 41 are removed by chemical-mechanical or mechanical polishing. Preferably, the layer 15 constitutes the first level of metallization (back end).

FIG. 5 also illustrates a step for making the trenches 51 opposite the transistors 23. The trenches 51 are formed in the structure illustrated in FIG. 4. The trenches 51 are intended to be closed to become the enclosed spaces 11 illustrated in FIGS. 1 to 3. In some embodiments, the trenches 51 are therefore of the same shape and dimensions as the desired enclosed spaces 11. The structure illustrated in FIG. 5 corresponds to the structure 13 and is, for example, a first wafer.

Figure 6:
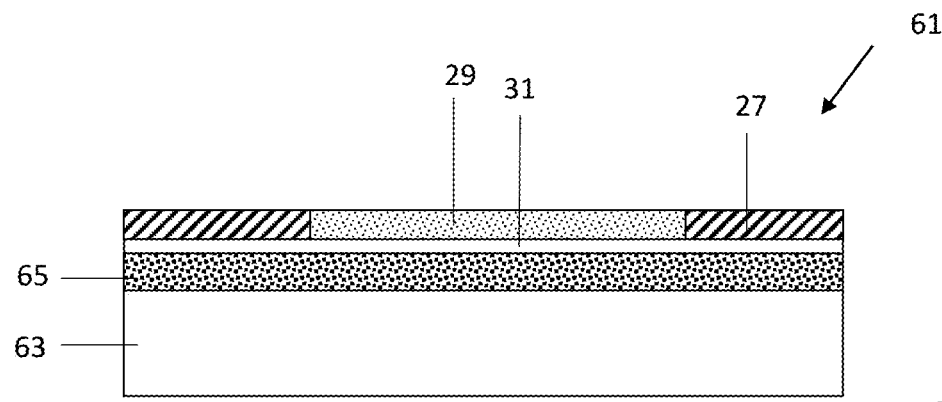
FIG. 6 is a partial schematic cross-sectional view illustrating another step in a method of implementing a manufacturing method for the device of FIGS. 1 to 3.

FIG. 6 is a partial schematic cross-sectional view illustrating another step of the implementation of the manufacturing method of device 1.

FIG. 6 represents a second wafer 61 comprising, in succession:
  a substrate 63 of a semiconductor material, for example of silicon.
  a layer 65, for example of oxide.
  the etch stop layer 31; and
  the metal layer 27 and the insulating layer 29.

As an example, layer 65 has a thickness between 100 nm and 500 nm and the substrate has a thickness of the order of 775 μm.

Figure 7:
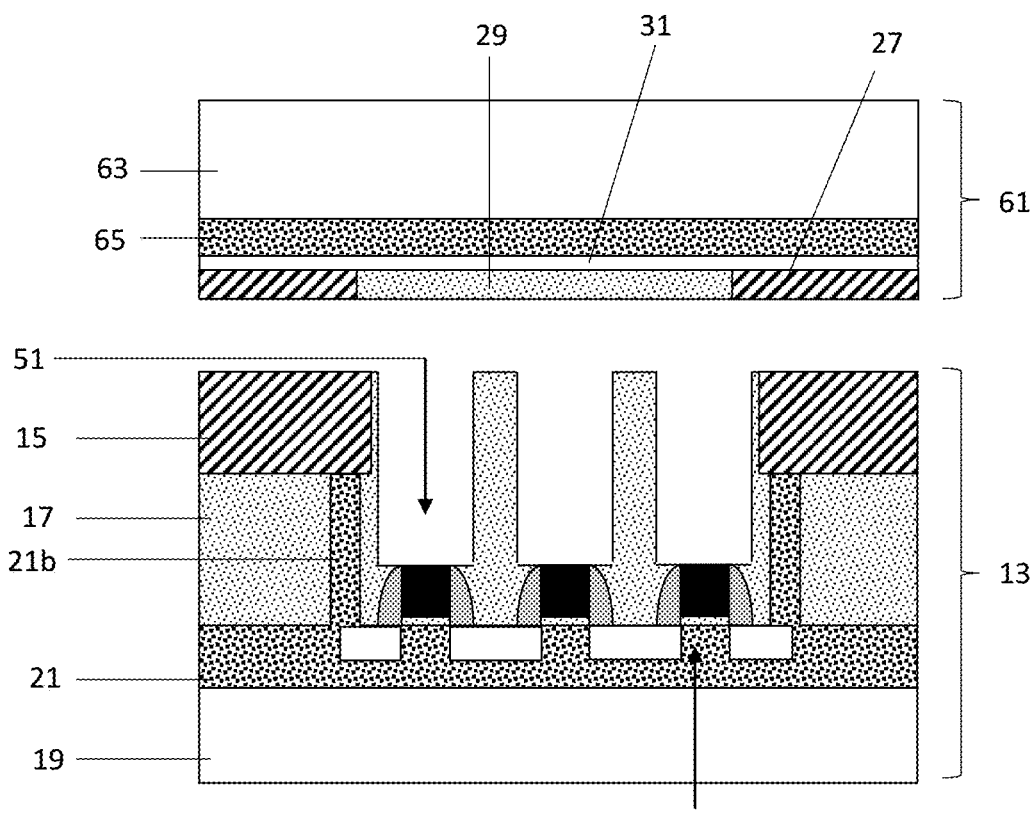
FIG. 7 is a partial schematic cross-sectional view illustrating another step in a method of implementing a manufacturing method for the device of FIGS. 1 to 3.

FIG. 7 is a partial schematic cross-sectional view illustrating another step of the implementation of the manufacturing method of device 1.

FIG. 7 corresponds to a step of assembling the first wafer illustrated in FIG. 5 and the second wafer illustrated in FIG. 6. More specifically, during the assembly step illustrated in FIG. 7, the second wafer 61 is, relative to its orientation in FIG. 6, turned over the first wafer 13 so that the upper face of the second wafer (in the orientation of FIG. 6) is in contact with the upper face of the first wafer (in the orientation of FIG. 5). The assembly step illustrated in FIG. 7 forms the enclosed spaces 11 by closing the trenches 51. In some embodiments, the assembly is carried out under an inert gas atmosphere or at least a partial vacuum, depending on the desired content of the enclosed spaces.

The adhesion between the first and second wafers comes from the hybrid bonding formed by bringing the layers 27 and 15 into contact. These layers 27 and 15 are of materials compatible with achieving a molecular bond. Preferably, the layers 15 and 27 are made of copper.

Figure 8:
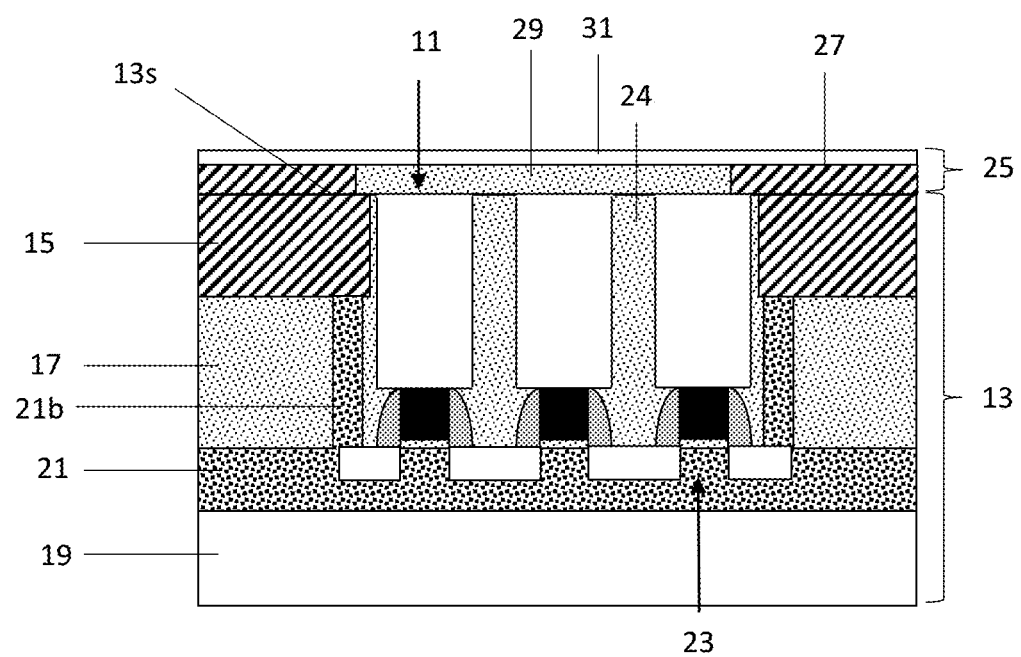
FIG. 8 is a partial schematic cross-sectional view illustrating another step in a method of implementing a manufacturing method for the device of FIGS. 1 to 3.

FIG. 8 is a partial schematic cross-sectional view illustrating another step of the implementation of the manufacturing method of device 1.

FIG. 8 corresponds to a step of removing the substrate 63 and the layer 65 of the structure illustrated in FIG. 7.

According to one method of implementation, FIG. 8 illustrates a step of etching the upper face of the structure illustrated in FIG. 7, e.g., etching the substrate 63 and the layer 65. In other words, FIG. 8 corresponds to a step of thinning the structure illustrated in FIG. 7 until reaching the etch stop layer 31.

Alternatively, the thinning of the structure illustrated in FIG. 7 to obtain the structure 25 is obtained by mechanical or chemical mechanical polishing (CMP) until the upper face of the layer 31 is revealed, in the orientation of FIG. 8.

Figure 9:
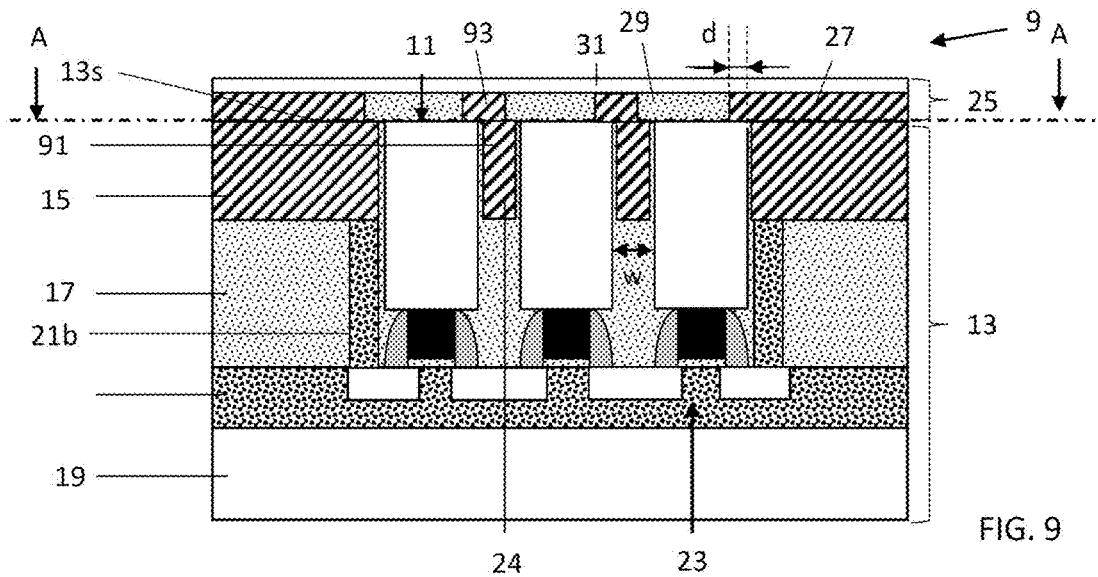
FIG. 9 is a partial schematic cross-sectional view of another embodiment of an electronic device.
Figure 10:
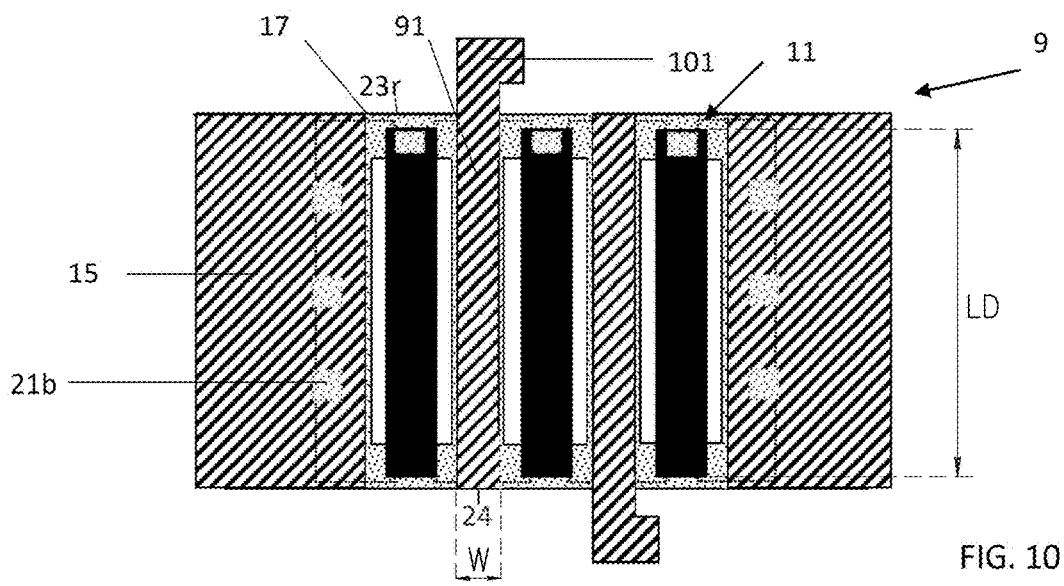
FIG. 10 is a partial schematic top view in a plane AA of FIG. 9 of the electronic device illustrated in FIG. 9.
Figure 11:
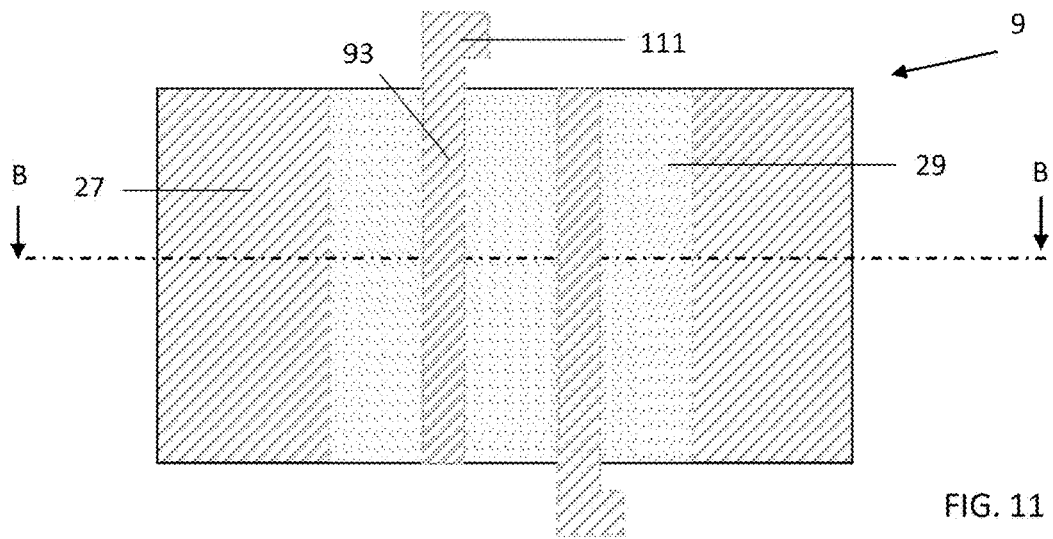
FIG. 11 is another partial schematic top view of the electronic device illustrated in FIG. 9.

FIGS. 9 to 11 are partial schematic views of one embodiment of an electronic device 9 comprising at least one enclosed space 11.

FIG. 9 is a cross-sectional view of one embodiment of the electronic device 9.

FIG. 10 is a top view in the longitudinal plane AA of FIG. 9.

FIG. 11 is a partial schematic top view of the electronic device 9, with FIG. 9 being a view according to the cross-sectional plane BB of FIG. 11.

The electronic device 9 is similar to the device 1 except that the device 9 comprises an intermediate hybrid bond between each of the enclosed spaces 11, in addition to the external hybrid bond on either side of all of the enclosed spaces 11 of device 9.

According to the embodiment illustrated in FIGS. 9 to 11, at the time of formation of the first wafer illustrated in FIG. 4, the additional openings 41 are made. The walls 24 are then further processed. For example, as shown in FIG. 9, the walls include a lower part including the (insulating) material of the layer 17 and an upper part including a metal 15 (e.g., the (conducting) material of the layer 15). The metal 15 is deposited after finishing the contacts. In one embodiment, portion 91 may be made with the same material as metal 15. In another embodiment, portion 91 may be made with the same material as metal 15 and during the same process when depositing the metal 15.

According to the embodiment illustrated in FIGS. 9 to 11, at the time of forming the second wafer illustrated in FIG. 6, layer 27 is formed with a pattern identical to the pattern of layer 15. The layer 27 illustrated in FIGS. 9 to 11 then comprises the portions 93 substantially opposite the portions 91.

The intermediate hybrid bond is achieved by putting into contact the portions 91 and the portions 93.

Depending on the alignment tolerances of the wafers when they are superimposed, the portions 91 and 93 are offset by the offset d, similar to layers 15 and 27.

As shown in FIG. 10, the portions 91, respectively 93, extend in the direction of the largest dimension LD of the trenches 51 so as to form contacts 101, respectively 111. The contacts 101 and 111 are formed outside of the stack of structures 13 and 25 in order to consolidate the secondary hybrid bond.

The embodiment illustrated in FIGS. 9 to 11 is preferred over the embodiment illustrated in FIGS. 1 to 3 if the width w of the walls 24 is greater than 600 nm. Indeed, for a width w greater than 600 nm, at least some of the portions 91 and at least some of the parts of the portions 93 will be in contact despite the possible offset d between the portions 91 and 93, the offset d being less than the width w.

One advantage of the present embodiment is that it allows for contact recovery between each transistor 23. Another advantage of the present embodiment is that it provides a more robust hybrid bond than the hybrid bonds of the embodiments shown in FIGS. 1 to 3.

Figure 12:
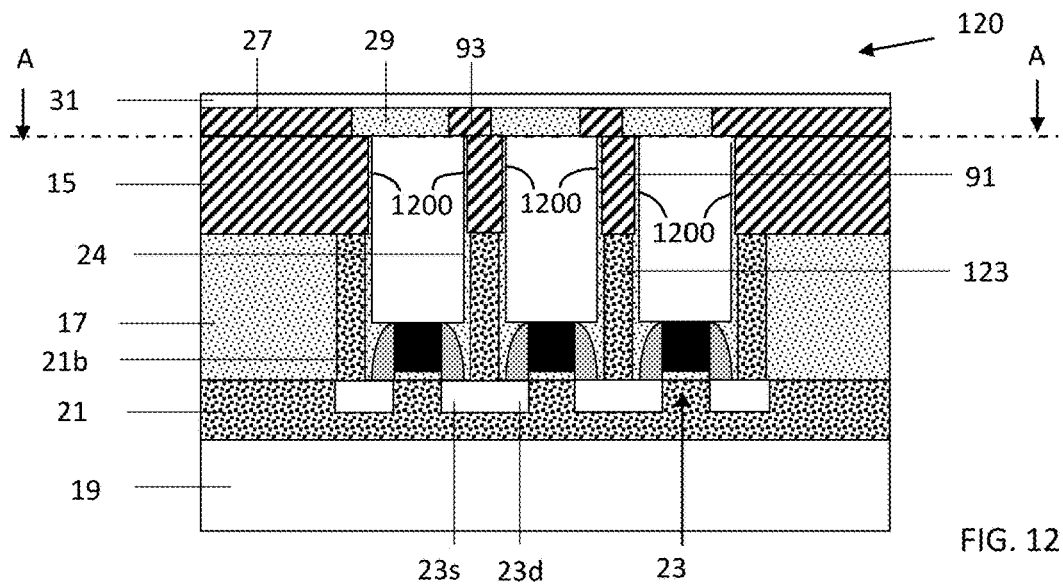
FIG. 12 is a partial schematic cross-sectional view of yet another embodiment of an electronic device.
Figure 13:
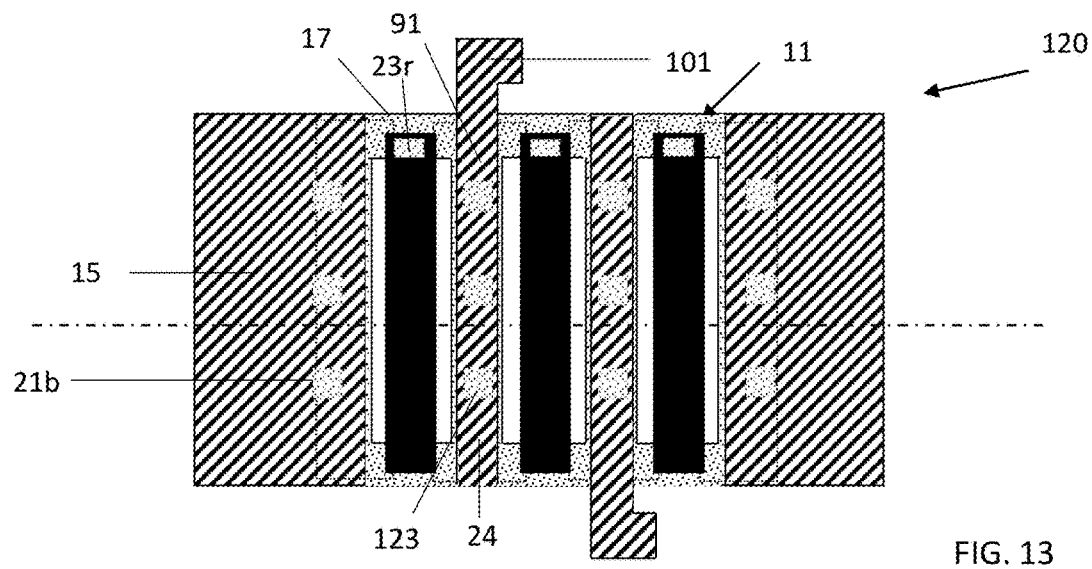
FIG. 13 is a partial schematic top view in a plane AA of FIG. 12 of the electronic device illustrated in FIG. 12.
Figure 14:
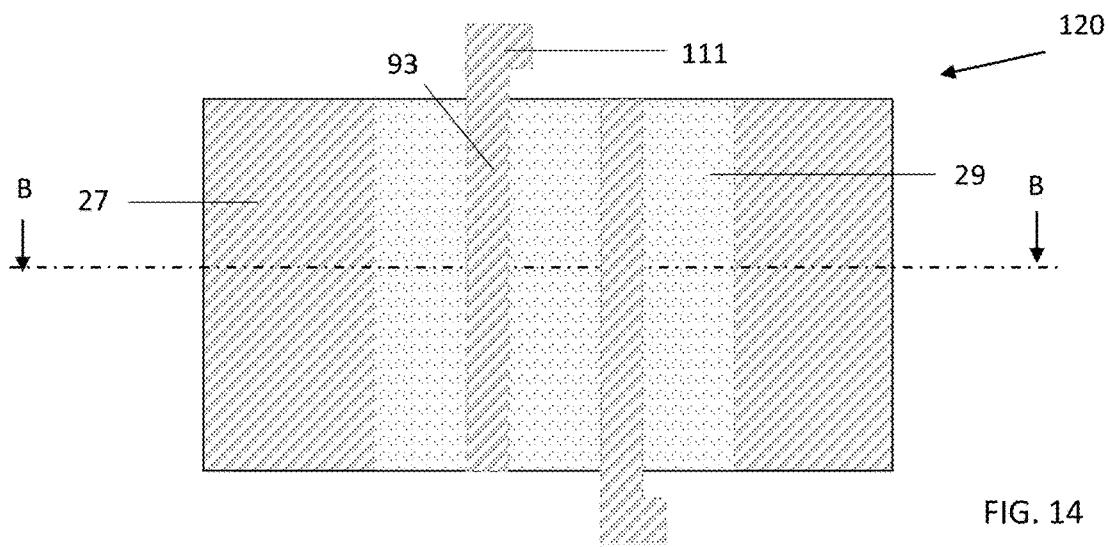
FIG. 14 is another partial schematic top view of the electronic device illustrated in FIG. 12.

FIGS. 12 to 14 are partial, schematic views of one embodiment of an electronic device 120 comprising at least one enclosed space 11.

FIG. 12 is a cross-sectional view of one embodiment of the electronic device 120.

FIG. 13 is a top view in the longitudinal plane AA of FIG. 12.

FIG. 14 is a partial schematic top view of the electronic device 120, with FIG. 12 being a view along sectional plane BB of FIG. 14.

The electronic device 120 is similar to the device 9 of FIGS. 9 to 11 except that the source and drain of each transistor 23 of the device 120 are connected, by contact pickups 123, to the portions 91. In addition, as shown in FIG. 12, a layer 1200 is positioned between layer 15 on the right and layer 15 on the left. The layer 1200, in one embodiment, is an oxide layer. For instance, the layer 1200 can be a low-K material (e.g., porous oxide).

The contact pickups 123 are, for example, pillars formed in the walls 24. The pillars 123 extend, for example, from the drain areas 23d and source areas 23s to the portions 91. As an example, the pillars 123 extend to different levels of metallization of the portions 91 or, if applicable, metal portions overlying the portions 91. As shown in FIG. 12, the layer 1200 may be positioned between space 11 and layer 15.

Figure 15:
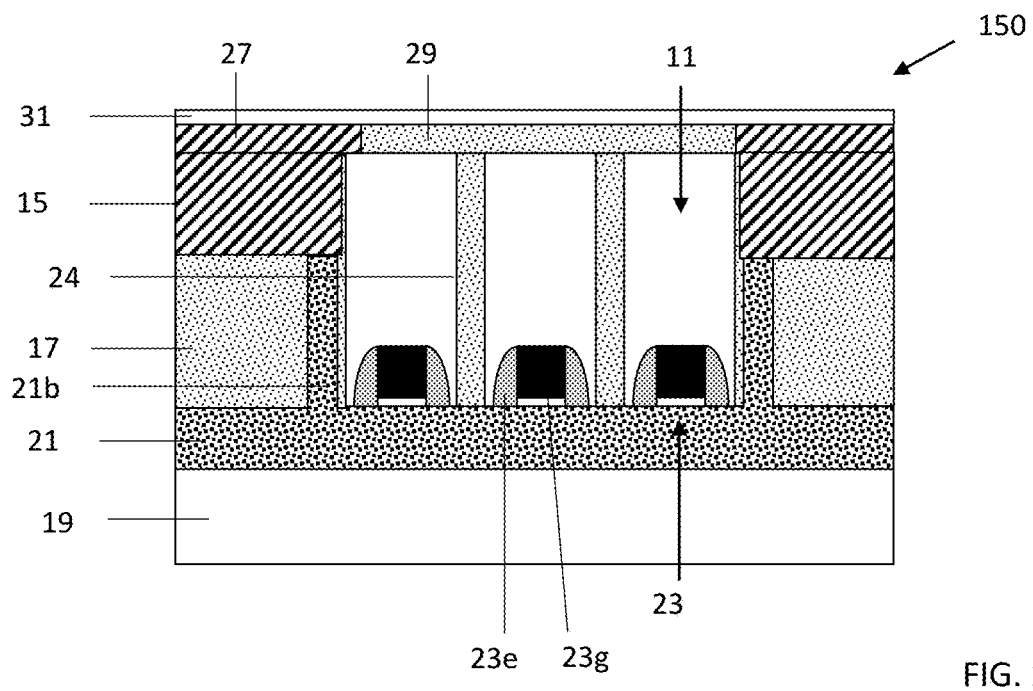
FIG. 15 is a partial schematic cross-sectional view of yet another embodiment of an electronic device.

FIG. 15 is a partial schematic view of one embodiment of an electronic device 150 comprising at least one enclosed space 11.

The electronic device 150 is similar to the device 1 of FIG. 1, except that, the trenches 51 are formed so as to laterally disassociate the gate-spacer assemblies from the layer 17.

This embodiment further improves the electrical insulation of the gate 23g relative to the drain and source contact of the transistors 23.

Figure 16:
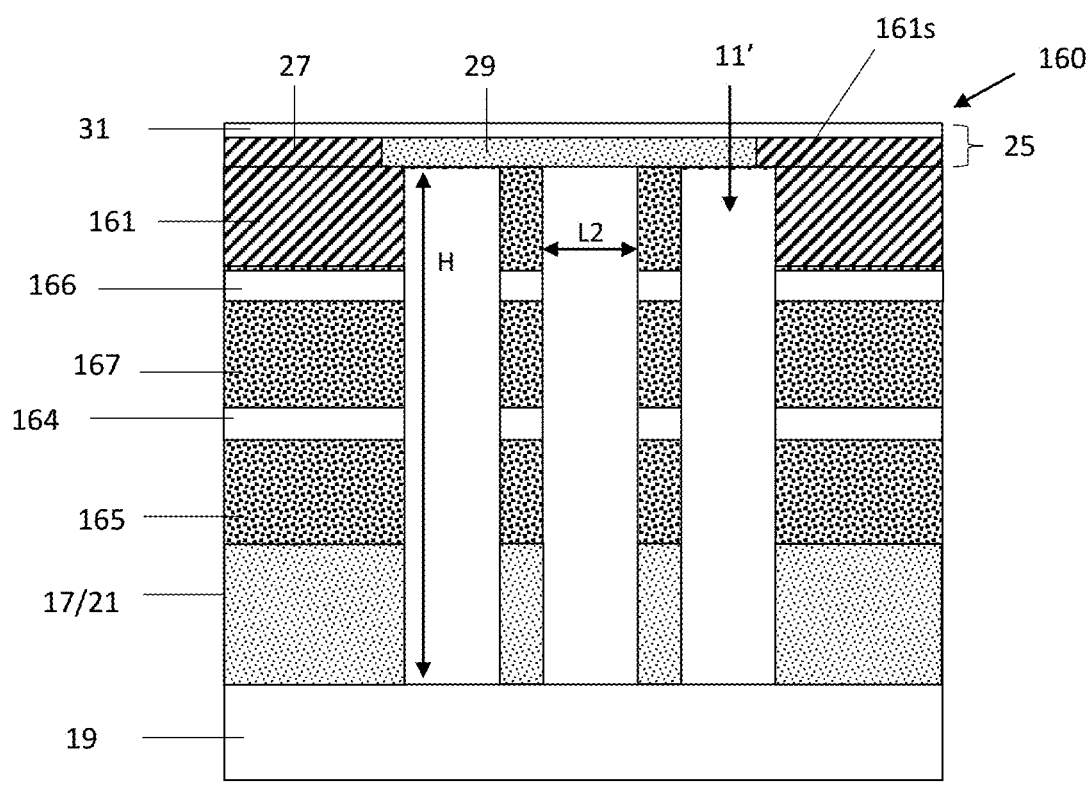
FIG. 16 is a partial schematic cross-sectional view of yet another embodiment of an electronic device.

FIG. 16 is a partial schematic view of one embodiment of an electronic device 160 comprising at least one enclosed space 11.

The device 160 is similar to the device 1, illustrated in FIG. 1, except that the device 160 comprises multiple levels of metallization 165 and 167 below an upper layer of metallization 161 used for the hybrid bonding. The upper metallization layer 161 is, for example, similar to the layer 15 of the device 1 illustrated in FIG. 1. Similar to the device 1 illustrated in FIG. 1, the layer 161, more specifically the upper face 161s of the layer 161, is surmounted by the structure 25. The layer 161 is used to integrate, in the embodiment illustrated in FIG. 16, the passive components such as metal-oxide-metal (MOM) capacitors or planar inductive windings.

For example, the metallization levels 165 and 167 correspond respectively to a first metallization level or Metal 1 and to a second metallization level or Metal 2. According to the embodiment illustrated in FIG. 16, layer 161 then corresponds to the third metallization level. However, in practice, layer 161 may correspond to a higher level of metallization.

According to the embodiment illustrated in FIG. 16, the different metallization levels are separated by contact etch stop layers (CESL), for example, of silicon nitride. The device 160 thus comprises a CESL layer 164 between layers 165 and 167 and a CESL layer 166 between layers 167 and 161. According to one embodiment, not represented, the layers 164 and 166 have vias through them made of one or more materials having, for example, a low dielectric constant.

According to one embodiment, not represented, the device 160 comprises connecting layers including lines and vias allowing the connection between the different levels of metallization. These said layers are, for example, oxide layers.

As in the device 1 illustrated in FIG. 1, the device 160 comprises enclosed spaces 11' extending through the metallization levels.

The enclosed spaces 11' have a width L2, for example, between 0.5 µm and 10 µm, preferably of the order of 1 µm. The enclosed spaces 11' have a height H, for example, between 1 µm and 10 µm, preferably between 2 µm and 5 µm.

The enclosed spaces allow active components, for example transistors formed in and on layer 21 and layer 19, to be spaced apart from passive components.

One advantage of the present embodiment is that it improves the insulation between the passive components and the substrate.

Various embodiments and variants have been described. Those skilled in the art will understand that certain features of these embodiments can be combined and other variants will readily occur to those skilled in the art. In particular, the embodiments illustrated in FIGS. 9 to 11 and 12 to 14 may be combined with the embodiments illustrated in FIGS. 15 and 16.

Finally, the practical implementation of the embodiments and variants described herein is within the capabilities of those skilled in the art based on the functional description provided hereinabove.

A method for manufacturing an electronic device (1; 9; 120; 150; 160) may be summarized as including a first wafer (13; 161) including at least one trench (51) and a second wafer (61), the second wafer being bonded, by hybrid bonding, to the first wafer, so as to form, at the level of the trench, at least one enclosed space (11; 11'), which is empty or gas-filled.

An electronic device, may be summarized as including a first wafer (13; 161) including at least one trench (51), and a second wafer (61) bonded, by hybrid bonding, to the first wafer, so as to form, at the level of the trench, at least one enclosed space (11; 11'), empty or gas-filled.

A method, or the device, may be summarized as including the first (13; 161) and second (61) wafers are made of semiconductor material.

The hybrid bonding may be achieved by putting the first regions (27, 93) of the second wafer into contact with the second regions (15, 91) of the first wafer.

The first regions (27, 93) and the second regions (15, 91) may be metal regions.

The first and second regions may be part of a metallization level.

The metal regions (27, 93, 15, 91) may be in copper.

The first regions (27) and the second regions (15) may surround the trenches (51).

The first regions (27, 93) and the second regions (15, 91) may be out of alignment in the device stack with a distance d less than 600 nm. For example, as shown in FIGS. 1 and 9, the first regions (27, 93) are stacked on top of the second regions (15, 91) within the electronic device to form a stack of a device stack. Here, the first regions (27, 93) and the second regions (15, 91) are out of alignment in the device stack with a distance d.

The second regions (15, 91) may be flush with a face of the first wafer (13), from which the trenches (51) may be formed.

Each device may include two first (27) and two second (15) regions on either side of the trenches (51) in a direction orthogonal to the largest dimension of the trenches.

The second wafer (61) successively may include, from a semiconductor substrate (63), an oxide layer (65), a silicon nitride layer (31), and an insulating layer (29) may include the first regions (27).

The semiconductor substrate (63) and the oxide layer (65) may be removed from the second wafer (61) after the hybrid bonding.

The first wafer (13) may include a substrate (19, 21) in and on which the transistors (23) may be formed.

The gate (23g) of each transistor (23) may be overlaid by one of the said enclosed spaces (11).

The trenches (51) may have a width (L2) between 0.2 µm and 1 µm and may extend over a height (H) between 0.2 µm and 1 µm.

The device may be a radio frequency switch.

The device may be a low noise amplifier.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
   a first wafer including:
      a first surface;
      at least one trench extending into the first wafer along a first direction; and
      a plurality of first regions surrounding the at least one trench, the plurality of first regions each having a first surface coplanar with the first surface and a second surface extending along the first direction;
   a second wafer hybrid bonded to the first wafer, the second wafer including a plurality of second regions each on a respective one of the plurality of first regions, each second region having a third surface extending along the first direction that is separated, along a second direction transverse to the first direction, from the respective second surface; and
   at least one enclosed space at the level of the trench of the first wafer.

2. The electronic device according to claim 1, wherein the first and second wafers are made of semiconductor material.

3. The electronic device according to claim 1, wherein the hybrid bonding of the second wafer to the first wafer includes putting the first regions of the plurality of first regions into contact with the second regions of the plurality of second regions, and
   wherein the first regions and the second regions are metal regions.

4. The electronic device according to claim 3, wherein the metal regions are in copper.

5. The electronic device according to claim 3, wherein the plurality of second regions surround the sat least one trench.

6. The electronic device according to claim 3, wherein each first region and each corresponding second region are separated along the second direction with a distance less than 600 nm.

7. The electronic device according to claim 3, wherein the second regions are flush with the first surface.

8. The electronic device according to claim 7, wherein each device includes two first and two second regions on either side of the at least one trench in the second direction.

9. The electronic device according to claim 3, wherein the first regions include a silicon nitride layer, and an insulating layer.

10. The electronic device according to claim 1, wherein the first wafer comprises a substrate and transistors.

11. The electronic device according to claim 10, wherein a gate of each transistor is overlaid by the at least one enclosed space.

12. The electronic device according to claim 1, wherein the at least one trench has a width along the second direction between 0.2 µm and 1 µm and extends over a height along the first direction between 0.2 µm and 1 µm.

13. The electronic device according to claim 1, wherein the device is a radio frequency switch.

14. The electronic device according to claim 1, wherein the device is a low noise amplifier.

15. A method for manufacturing an electronic device, the method comprising:
   forming at least one trench extending into a first wafer along a first direction;
   hybrid bonding a second wafer to the first wafer forming at the level of the at least one trench, at least one enclosed space, the second wafer including first regions and the first wafer including second regions; and
   aligning the first regions of the second wafer and the second regions of the first wafer so that the first and second regions are out of alignment by a first distance along a second direction transverse to the first direction.

16. The method according to claim 15, wherein hybrid bonding a second wafer to the first wafer includes:
   contacting first regions of the second wafer to second regions of the first wafer.

17. The method according to claim 15, further comprising:
   aligning the first regions of the second wafer and the second regions of the first wafer so that the second regions are flush with a face of the first wafer in which the at least one trench is formed.

18. The method according to claim 15, further comprising:
   forming a transistor in or on the first wafer;
   forming a gate electrode of the transistor; and
   overlaying the at least one enclosed space over the gate electrode of the transistor.

19. An electronic device comprising:
   a first wafer having first regions;
   at least one trench;
   a second wafer bonded to the first wafer, the second wafer having second regions, the first regions of the first wafer and the second regions of the second wafer surround the at least one trench, the first regions and the second regions are out of alignment, and the second regions are flush with a face of the first wafer in which the at least one trench is formed.

20. The electronic device according to claim 19, wherein the first and second regions are part of a metallization level.

* * * * *

UNITED STATES PATENT AND TRADEMARK OFFICE
CERTIFICATE OF CORRECTION

| | | |
|---|---|---|
| PATENT NO. | : 12,308,514 B2 | Page 1 of 1 |
| APPLICATION NO. | : 17/701340 | |
| DATED | : May 20, 2025 | |
| INVENTOR(S) | : Sebastien Cremer | |

It is certified that error appears in the above-identified patent and that said Letters Patent is hereby corrected as shown below:

In the Claims

<u>Column 11, Claim 5, Line 40:</u>
"the sat least one" should read: --the at least one--.

<u>Column 12, Claim 16, Line 26:</u>
"wafer includes:" should read: --wafter includes--.

Signed and Sealed this
Twenty-second Day of July, 2025

Coke Morgan Stewart
*Acting Director of the United States Patent and Trademark Office*